(12) United States Patent
Bollenz et al.

(10) Patent No.: US 7,242,701 B2
(45) Date of Patent: Jul. 10, 2007

(54) LASER WAVELENGTH CONTROL ARRANGEMENT AND METHOD

(75) Inventors: Bernd Bollenz, Nuremberg (DE); Konrad Czotscher, Nuremberg (DE); Dieter Werner, Neunkirchen am Brand (DE)

(73) Assignee: Lucent Technologies Inc., Murray Hill, NJ (US)

( * ) Notice: Subject to any disclaimer, the term of this patent is extended or adjusted under 35 U.S.C. 154(b) by 327 days.

(21) Appl. No.: 11/058,331

(22) Filed: Feb. 15, 2005

(65) Prior Publication Data

US 2006/0182157 A1    Aug. 17, 2006

(51) Int. Cl.
*H01S 3/13* (2006.01)

(52) U.S. Cl. ............... 372/29.016; 372/29.02

(58) Field of Classification Search ........... 372/29.02, 372/29.016, 32, 34
See application file for complete search history.

(56) References Cited

U.S. PATENT DOCUMENTS

| 4,608,697 | A |   | 8/1986 | Coldren |
| 5,220,578 | A |   | 6/1993 | Koch et al. |
| 6,292,497 | B1 | * | 9/2001 | Nakano ............... 372/29.015 |
| 6,516,010 | B1 | * | 2/2003 | Broutin et al. .......... 372/29.01 |
| 6,570,900 | B2 | * | 5/2003 | Furumoto et al. ........... 372/54 |

* cited by examiner

*Primary Examiner*—Minsun Oh Harvey
*Assistant Examiner*—Tuan N. Nguyen

(57) ABSTRACT

Wavelength control and stabilization of a laser is achieved by a practical, inexpensive, and accurate technique adapted for most optical transmission system applications by a method involving a laser characterization phase and a laser wavelength control and stabilization phase. This technique is applicable to both single mode lasers and multimode lasers. It is especially useful in those applications where the desired laser output power can vary over a wide range, including relatively low power above the lasing threshold.

4 Claims, 7 Drawing Sheets

LASER WAVELENGTH CONTROL ARRANGEMENT AND METHOD

BACKGROUND OF THE INVENTION

1. Field of the Invention

This invention relates to a method and apparatus for controlling and stabilizing the operating wavelength of a laser operating at different output power levels and, more particularly, for controlling and stabilizing the operating wavelength for a semiconductor laser.

2. Description of the Related Art

Optical transmission systems rely heavily on the use of lasers in the transmission network. Optical signals output by lasers are modulated directly or by external modulation to carry information and control signals in optical networks. As the information signals traverse the optical network, they are amplified by Raman techniques or by discrete amplification techniques that rely on pump lasers to stimulate the amplification process. In all these applications, control of laser operating parameters such as output power and operating wavelength is necessary. As the lasers age or undergo environmental changes such as temperature changes, control of the operating wavelength becomes even more critical. Control and stabilization of the wavelength and power of the laser becomes even more difficult when the target values for these parameters are expected to assume one of a multiplicity of values in wide respective ranges.

Various techniques have been developed to stabilize or control the laser operating wavelength, that is, the center emission wavelength of the laser. These techniques include the use of gratings or a wavelength locker device. Gratings can be internal to the laser cavity such as in distributed feedback (DFB) lasers or distributed Bragg reflector (DBR) lasers. Gratings are also written on optical fibers to form a device known as a fiber Bragg grating. Wavelength lockers can operate internal or external to the laser cavity and generally provide wavelength control and monitoring for tunable lasers. Typically, wavelength lockers provide a relative reference for tuning the operating wavelength. No one of these techniques is applicable to all the specific situations that can occur in a transmission system.

DFB and DBR lasers generally provide an optical output spectrum that exhibits a very narrow linewidth. High power transmission for such a narrow linewidth laser is severely hampered because the stimulated Brillouin scattering (SBS) threshold limits the power spectral density that can be transmitted by an optical fiber before SBS deteriorates signal transmission in the fiber. Dithering of the operating wavelength is the technique resorted to in order to avoid or ameliorate the effects of SBS. But this technique is inapplicable to pump lasers used for Raman amplification because it would have the deleterious effect of amplitude modulating the gain in direct response to the dithering applied to the pump laser. As a result, the optical transmission signal would be degraded.

Lasers stabilized by the use of fiber Bragg gratings exhibit a high relative intensity noise (RIN) which limits the suitability of such stabilized lasers as a co-propagating pump lasers in Raman amplification applications. In addition, proper operation of the fiber Bragg grating stabilization technique requires a relatively high laser output power. In a low laser output power environment, the fiber Bragg grating stabilization technique cannot lock the center emission wavelength of the laser over to the desired wavelength designated by the fiber Bragg grating.

Wavelength lockers are relatively expensive and decrease the available power budget because of insertion and device losses. These devices, especially state of the art devices, are only operable with single mode lasers. But lasers that are used as pump lasers in optical amplifier applications tend not to be single mode lasers. Moreover, wavelength locked lasers are operable over a very limited output power range. When a wavelength locked signal laser is initialized in a wavelength division multiplexed (WDM) system, the injection current to the laser is changed to achieve the desired output power. Injection current changes cause a concomitant detuning in the operating wavelength of the laser, which can be sufficiently large to cause interference in the adjacent WDM channels.

None of the techniques known in the prior art provide for practical, inexpensive, and accurate wavelength stabilization and control in a wide range of laser applications and for a broad range of laser output powers, especially where that range includes low output power.

SUMMARY OF THE INVENTION

A practical, inexpensive, and accurate wavelength control technique adapted for lasers in most optical transmission system applications including low output power applications is achieved by a method involving a laser characterization phase and a laser wavelength control and stabilization phase.

The laser characterization phase is used for characterizing desired parameters of the laser and includes the method steps of monitoring a set of one or more operating parameters selected from the group consisting of injection current supplied to the laser, operating temperature of the laser, operating wavelength of the laser, and output power of the laser; characterizing a reference laser injection current $I_0$ as a function of the laser output power $P_{out}$ for a constant reference temperature of the laser $T_0$; characterizing a laser injection current I and a corresponding laser temperature T as a function of the laser output power $P_{out}$ at a constant operating wavelength substantially equal to a target wavelength $\lambda_0$; computing a ratio of the characterized laser injection current $I_0$ to the characterized laser injection current I in order to determine a relative efficiency $\eta_{rel}$ of the laser; determining a relationship between the change in laser temperature $\Delta T$ and a change in relative efficiency $\Delta\eta_{rel}$ for the laser when the wavelength of the laser is maintained substantially constant at least at the target wavelength $\lambda_0$; and storing characterizations of the reference laser injection current and the laser injection current.

The laser wavelength control and stabilization phase is used for controlling the operating wavelength of the laser at a desired output power level and includes the methods steps of controlling the injection current I to the laser so that a difference between the target output power $P_0$ and the output power $P_{out}$ is less than or equal to a predetermined power threshold; determining a measured relative efficiency $\eta_{rel,meas}$ for the laser operating at the output power $P_{out}$ and a wavelength $\lambda_1$ as a ratio of the injection current and the characterized reference injection current; comparing a difference between the measured relative efficiency $\eta_{rel,meas}$ and a target relative efficiency $\eta_{rel,target}$ to a wavelength adjustment threshold value $\epsilon$, wherein the target relative efficiency and the wavelength adjustment threshold value are stored in the controller; and if the difference of relative efficiencies is greater than the wavelength adjustment threshold value, controlling the laser temperature to change by an amount determined from said relationship between the change in laser temperature $\Delta T$ and the change in relative efficiency $\Delta\eta_{rel}$ for the laser when the wavelength of the laser is maintained substantially constant at least at the target wavelength $\lambda_0$, so that the laser concurrently operates substantially at the target wavelength $\lambda_0$ and substantially at the target output power $P_0$.

This invention is applicable to both single mode lasers and multimode lasers. It is especially useful in those applications where the laser output power can vary over a wide range, including relatively low power above the lasing threshold.

BRIEF DESCRIPTION OF THE DRAWINGS

A more complete understanding of the invention may be obtained by reading the following description of specific illustrative embodiments of the invention in conjunction with the appended drawings in which.

Figure 1:
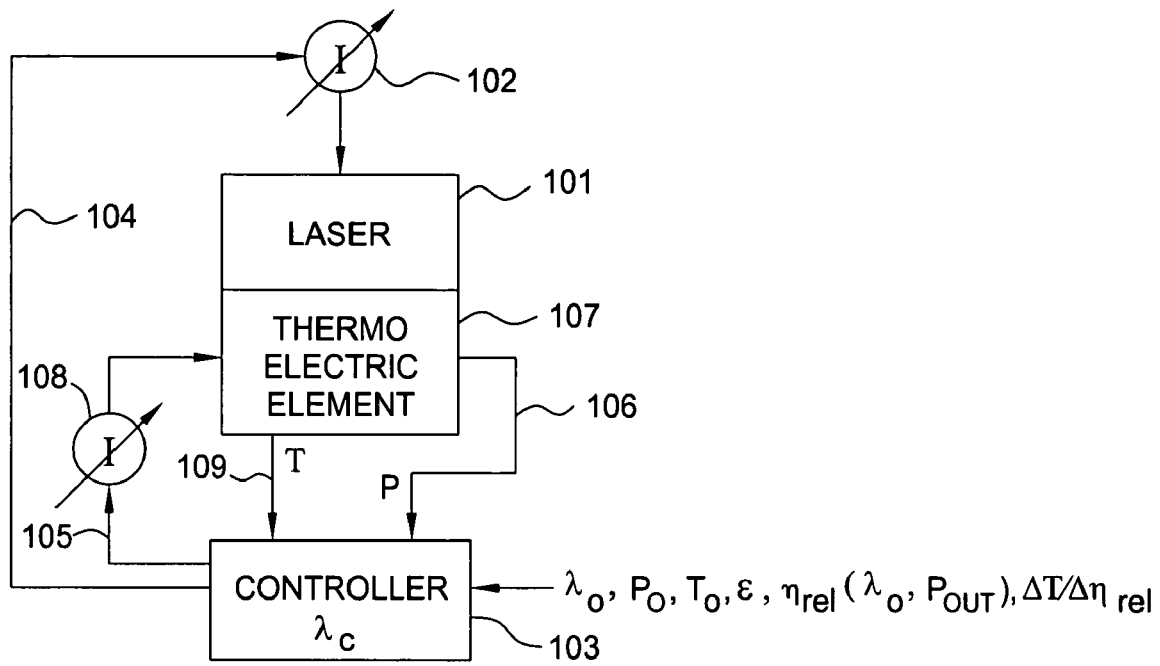
FIG. 1 shows an exemplary laser operating parameter characterization and wavelength control and stabilization arrangement realized in accordance with the principles of the present invention.

It is to be noted, however, that the appended drawings illustrate only typical embodiments of this invention and are therefore not to be considered limiting of its scope, for the invention may admit to other equally effective embodiments. Where possible, identical reference numerals have been inserted in the figures to denote identical elements.

DETAILED DESCRIPTION

The following terms and variables used within this description are provided below for ease of reference:

$P_{out}$=laser output power;
$P_0$=target laser output power;
I=laser injection current;
$I_0$=reference laser injection current;
$\lambda_c$=laser wavelength;
$\lambda_0$=target wavelength;
$\eta_{rel}$=relative efficiency;
$\Delta\eta_{rel}$=relative efficiency change;
$\Delta T$=temperature change;
$\epsilon$=wavelength adjustment threshold value;
t=time; and
$t_0$=reference time.

A typical operating environment for practicing the present invention is shown in a simplified block diagram in FIG. 1. A laser 101 driven by a controllable injection current source 102 is monitored, measured, stabilized, and controlled to operate at a desired target operating wavelength and output power by a controller 103. Controller 103 supplies appropriate control signals both to the controllable current source 102 that supplies the laser injection current on lead 104 and to the controllable current source 108 coupled to the thermoelectric element 107 on lead 105 for adjusting the laser temperature.

The laser assembly is understood to include laser 101, the controllable current sources 102 and 108, and the controllable thermoelectric element 107 coupled to the laser 101. Controllable thermoelectric elements such as a Peltier element, which is well known in the art, can be utilized to provide a controlled temperature to the laser 101. Controllable current source 108 coupled to controllable thermoelectric element 107 receives control signals from controller 103 via lead 105 to increase or decrease the laser temperature.

Leads 106 and 109 are shown in FIG. 1 to denote the availability of laser operating parameters from the laser for the controller 103. The parameters to be utilized by the controller include the output power (P), the temperature (T), the operating wavelength ($\lambda_c$), and the injection current (I). In FIG. 1, only the power and temperature are shown. These parameters can be monitored and measured in a variety of well known ways by controller 103 or by specific monitoring devices and circuitry coupled to the laser. For example, back face monitoring of a semiconductor laser can provide access to the output power and indirectly to the laser operating wavelength, the actual temperature of the laser can be measured from the controllable thermoelectric heating element by a thermistor or the like via lead 109, the actual temperature of the laser can alternatively be measured from the control signals applied on lead 105, and the injection current can be measured from the current source via lead 104. It is expected that the operating wavelength is to be determined using the techniques of the present invention described below.

Controller 103 can be realized as a hardware, firmware or software control device. A digital signal processor (DSP) or application specific integrated circuit (ASIC) can be employed for this purpose. In general, the controller is capable of information processing and includes at least one internal or external storage medium for storing initial and measured parameters that are required for the operation of the device according to the present invention. The controller is initialized or initially programmed with certain desired or target values that are used according to the principles of the invention to achieve the appropriate amount of wavelength stabilization and control. The initial values that are contemplated being used by the controller are depicted in FIG. 1 as a threshold value ($\epsilon$), the target operating wavelength ($\lambda_0$), the desired output power ($P_{out}$), an initial temperature ($T_0$), the relative efficiency ($\eta_{rel}$), and the change in temperature versus the change in relative efficiency ($\Delta T/\Delta\eta_{rel}$).

It should be understood that output power and operating wavelength are among the most important static parameters characterizing laser performance. The operating wavelength of a laser such as a semiconductor laser is well understood to be dependent upon the laser chip temperature and carrier density in the gain medium or active region of the laser. Hence, as the injection current changes or as the chip temperature changes, the operating wavelength of the laser will undergo a shift. This wavelength shift can be caused by aging of the laser wherein it is necessary over time to increase the injection current to maintain a desired output power. It can also be caused by a need for increased or decreased output power from the laser which can be achieved by a corresponding change in the injection current to the laser. But such a shift can be deleterious in certain system environments such as Raman pumping or DWDM where, for example, it is crucial to maintain a constant operating wavelength for the laser as well as a desired output power level. The shift can be compensated to a certain degree by laser temperature adjustments. It is the recognition of a particular interplay of temperature and injection current adjustments that is critical to developing and understanding the principles of the present invention.

Figure 2:
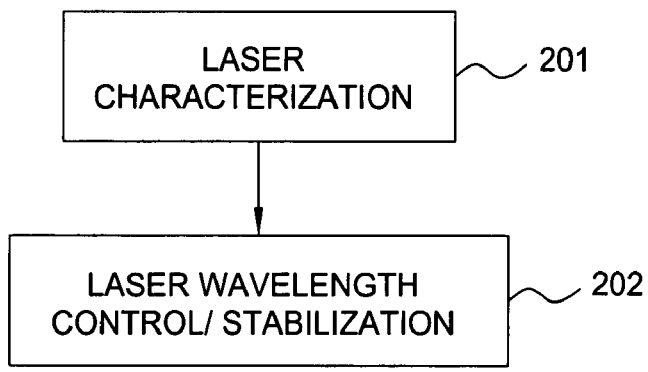
FIG. 2 shows a simplified flowchart of the joint laser operating parameter characterization and wavelength control and stabilization method.

As described above and depicted in the simplified flowchart of FIG. 2, the present invention is directed to a method for measuring and monitoring certain operating parameters in step 201 in order to characterize the laser (e.g., the relative injection current efficiency of the laser) and then for controlling and/or stabilizing the operating wavelength of the laser in step 202 via the characterization and further parameter observations in order to obtain a target operating wavelength at a desired output power level. This method advantageously controls the operating wavelength from the beginning of life for the device until its end of life at all levels of output power. The term "operating wavelength" is understood to mean a particular wavelength at which the laser is classified as operating such as the center emission wavelength, that is, a wavelength central to the band of wavelengths emitted by a laser in operation, regardless of whether the laser operates as a single mode or multimode laser. Given that some classes of lasers lack the stability to maintain a truly single mode output at a consistent wavelength, the term is also understood to encompass a small band of wavelengths about a nominal central wavelength.

Relative injection current efficiency or relative efficiency of the laser, $\eta_{rel}$, is defined as the ratio of two measured injection currents. The first reference current in the numerator of the ratio is denoted $I_0$ and is measured as a function of the output power of the laser $P_{out}$ at an arbitrary reference temperature $T_0$ and at a reference time $t_0$. The second reference current in the denominator of the ratio is denoted as $I$ and is measured as a function of the laser temperature $T$ and the time $t$ at the same output power of the laser $P_{out}$ and at the target operating wavelength $\lambda_0$. Mathematically, the relative efficiency of the laser is expressed as follows:

$$\eta_{rel} \equiv \frac{I_0(P_{out}, T = T_0, t = t_0)}{I(P_{out}, T, \lambda_c = \lambda_0, t)}, \quad (1)$$

where $\lambda_c$ is the operating or center emission wavelength of the laser.

Changes in relative efficiency can result from aging of the laser and from temperature changes for the laser, just to name several possible sources of efficiency changes. It can be assumed without any loss of accuracy or generality that any change in relative efficiency $\Delta\eta_{rel}$ due to laser temperature change is substantially equal to any relative efficiency change due to aging. As a result, $\eta_{rel}$ is dependent on $P_{out}$ and $\lambda_c=\lambda_0$. As long as $\eta_{rel}$ is maintained substantially constant for a given output power $P_{out}$, then the operating wavelength can be maintained at the target wavelength $\lambda_c=\lambda_0$ over the life of the laser.

In light of the description above, it will be appreciated by persons skilled in the art that the desired output power $P_{out}$ and the target operating wavelength $\lambda_c=\lambda_0$ can both be achieved simply by adjusting the laser temperature (also known as the chip temperature for semiconductor lasers) and the injection current to obtain the desired relative injection current efficiency $\eta_{rel}(P_{out}, \lambda_c=\lambda_0)$. Wavelength control can therefore be accomplished by understanding the relationship between the laser temperature and the output power at the target operating wavelength. Although the change in efficiency over time until the end of life for the laser is not known, it is possible to measure the change in efficiency as a function of laser temperature at the beginning of the laser's life, namely, at time $t=t_0$.

Figure 3:
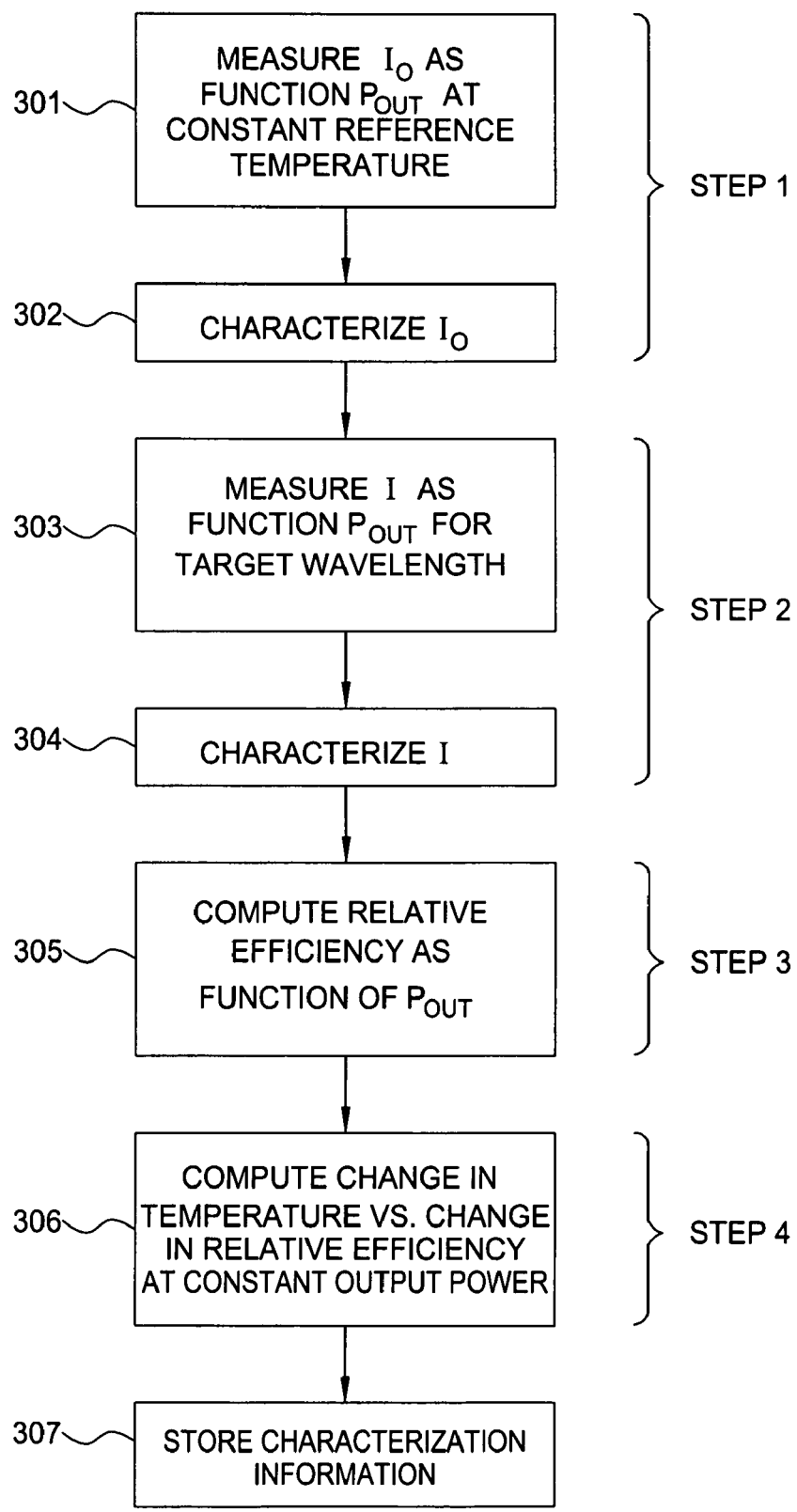
FIG. 3 shows details of the laser operating parameter characterization method shown in FIG. 2.

One exemplary method for measuring the parameters and characterizing the laser operations via the functions described above is shown in the flowchart depicted in FIG. 3. The method is particularly well suited to semiconductor lasers, but it can be extended to other types of lasers as well.

Step 1 is comprised of operational blocks 301 and 302. The purpose of step 1 is to characterize the laser injection current $I_0$ (shown as the numerator of $\eta_{rel}$ function) as a function of the output power $P_{out}$ for a constant reference temperature $T_0$ of the laser. In this step, the reference temperature is selected to be in the middle of a specified operating range for the laser chip temperature. For this portion of the characterization process, it is expected that the operating wavelength $\lambda_c$ of the laser will vary as the output power is changed.

Figure 4:
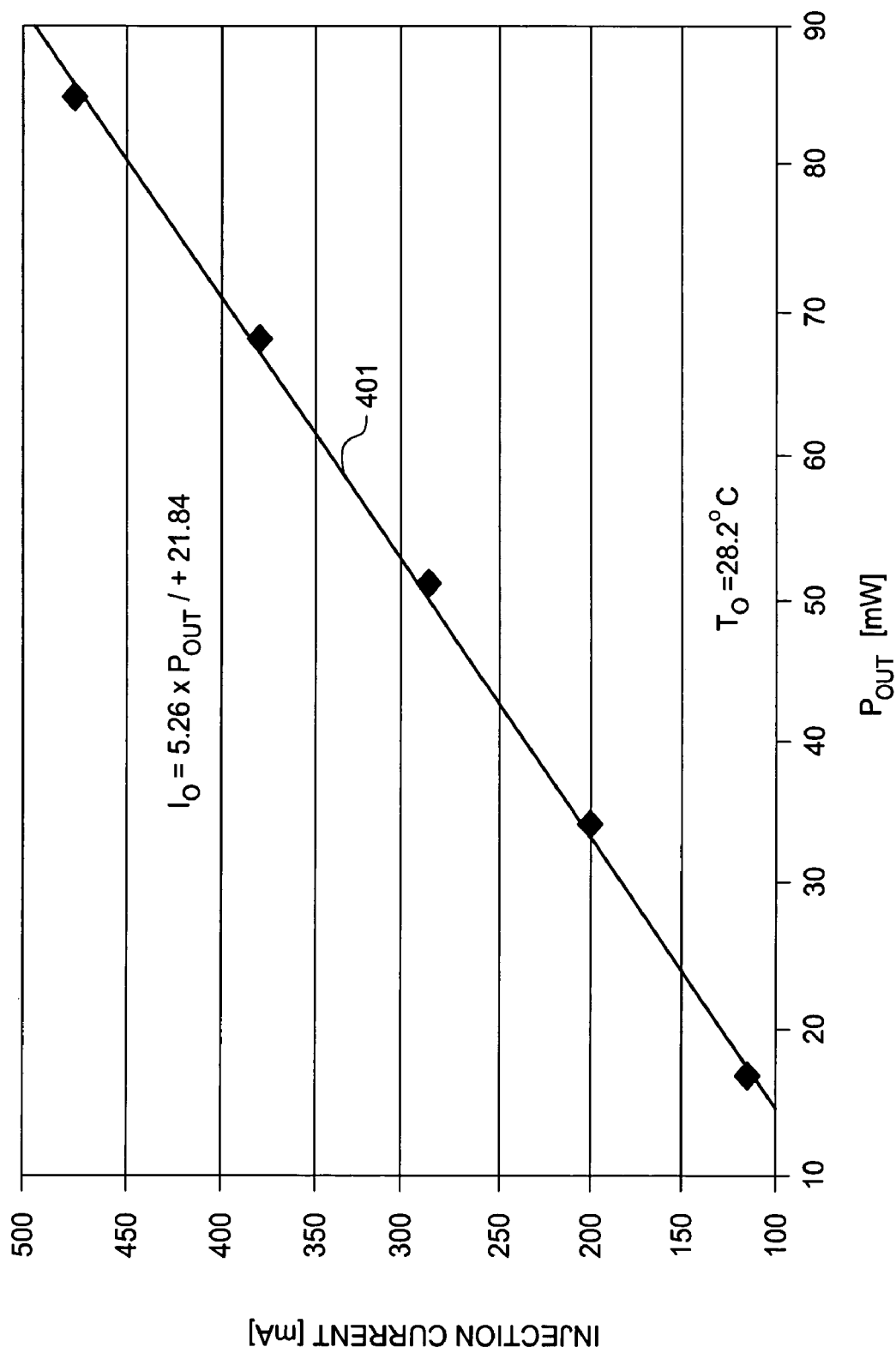
FIGS. 4–6 show exemplary graphical results at various stages in the laser operating parameter characterization method of FIG. 3.

When the injection current and output power data points are collected, the data points can be fit or approximated using a particular function or curve. For example, a linear function can be used for the curve fitting of the data points as shown in FIG. 4, where intermediate points between the measured data points are determined using linear interpolation techniques. At the completion of step 1, the data points in FIG. 4 are fit to the exemplary linear function shown as line 401 and described mathematically as:

$$I_0 = 5.26 \times P_{out} + 21.84, \quad (2)$$

where the injection current $I_0$ is expressed in milliamps (mA) and the output power $P_{out}$ is expressed in milliwatts (mW) and wherein the reference temperature is $T_0=28.2°$ C. As is apparent to those persons skilled in the art, more complex curve fitting techniques or analysis tools or even more observed data points can be used to compute functions that fit the data points even more accurately. It is contemplated that the accuracy of the analysis can be even further improved by fitting the computed function in a manner that the wavelength deviation from the target wavelength is minimized.

Step 2 of the characterization portion of the method includes operational blocks 303 and 304. The purpose of step 2 is to characterize the injection current I (denominator of $\eta_{rel}$ function) and the corresponding laser temperature T as a function of output power $P_{out}$ for the laser while maintaining the operating wavelength of the laser ($\lambda_c$) constant at the target wavelength $\lambda_0$. It is expected that the temperature of the laser will also have to be adjusted as the output power is changed in order to maintain a constant wavelength for the laser.

In block 303, the injection current I and the corresponding laser temperature T are measured as the output power is varied over the range of interest while maintaining the laser operating wavelength constant at a desired target operating wavelength $\lambda_0$. In block 304, the injection current I and the corresponding laser temperature T are characterized in mathematical terms such as in a formulaic representation similar to the representation shown above in step 1.

Figure 5:
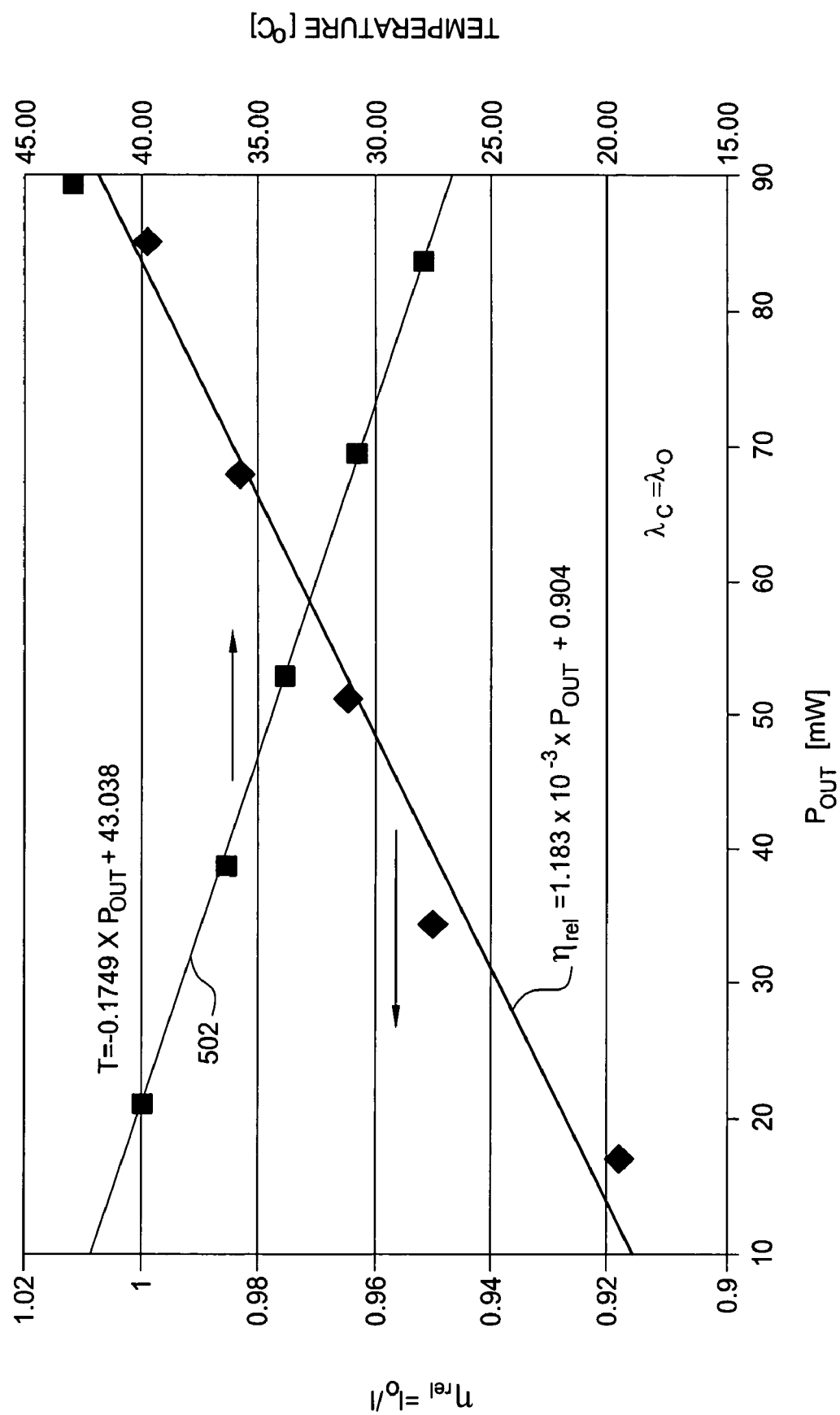

Step 3 of the characterization portion of the method includes operational block 305. In operational block 305, the relative efficiency of the laser $\lambda_{rel}$ is computed as a function of the output power by calculating the ratio of the injection current $I_0$ found in step 1 and the injection current I found in step 2. That is, $\eta_{rel}$ is equal to the ratio $I_0/I$ as depicted above in Eq. 1. An exemplary plot of the relative efficiency $\eta_{rel}$ as a function of the output power $P_{out}$ at a target operating wavelength of $\lambda_0=1499$ nm is shown in FIG. 5. The corresponding laser temperature T as a function of the output power is shown in the same plot. At the completion of step 3, the data points in FIG. 5 are fit to an exemplary linear functions shown as lines 501 and 502 and described mathematically as:

$$\eta_{rel}=1.2\times10^{-3}\times P_{out}+0.904, \text{ and} \quad (3)$$

$$T \times -0.1749 \times P_{out}+43.038. \quad (4)$$

where the output power $P_{out}$, is expressed in milliwatts (mW) and the temperature T is in degrees Celsius (° C.).

Step 4 of the characterization portion of the method includes operational block 306. The purpose of step 4 is to determine the change in laser temperature $\Delta T$ versus the change in relative efficiency $\Delta \eta_{rel}$. This relation can be computed as $$(\Delta T/\Delta \eta_{rel})=(\Delta T/\Delta P)/(\Delta P/\Delta \eta_{rel})|_{\lambda=const}. \quad (5)$$

Figure 6:
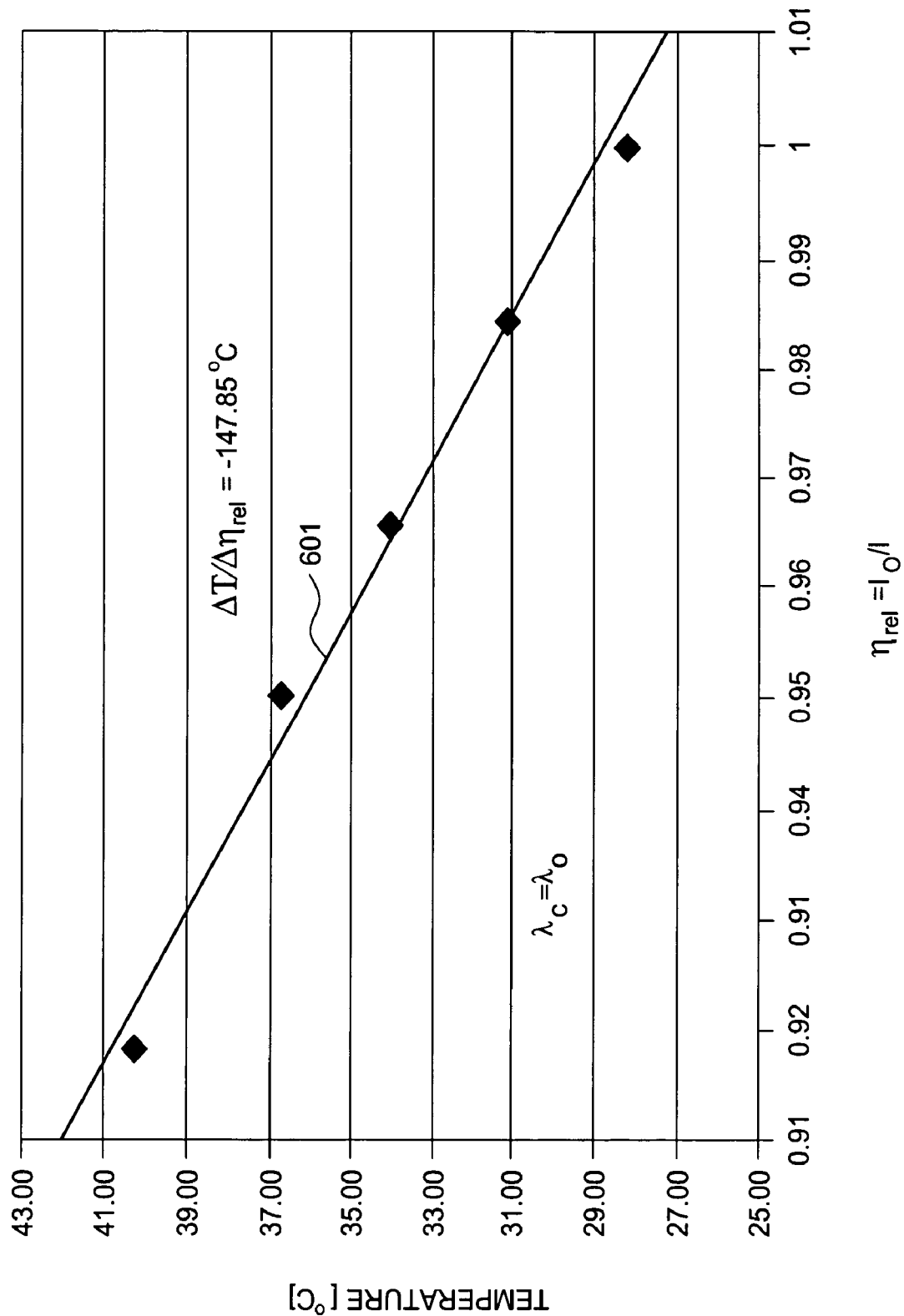

Using Eqs. 3 and 4, the change of relative efficiency versus temperature change results in $\Delta T/\Delta \eta_{rel} \approx -147.8°$ C. This relation also may be determined directly from FIG. 6. There, the temperature T of the data points determined in Step 3 for a constant wavelength is plotted as a function of the relative efficiency $\eta_{rel}$. The data points are then fit to a linear function shown as line 601 exhibiting a slope expressed as $\Delta T/\Delta \eta_{rel}$, where the slope $\Delta T/\Delta \eta_{rel}$ is approximately equal to $-147.85°$ C. for a constant value of $\lambda_c=\lambda_0$. This is equivalent to the relation in Eq. 5 above.

In the final step of the characterization portion of the method, the characterization information is stored in the associated storage of the controller as shown in operational block 307. The information collected during the laser characterization is stored in a medium such as random access memory or EEPROM or the like associated with and available to the controller. With this information from the characterization process available to the controller, it is possible to stabilize and control the wavelength of the laser to a desired target wavelength for a particular output power in a range of output powers. The control process is described below and depicted in the flowchart shown in FIG. 7.

Initially, the laser is operated at a target output power $P_{out}$ within the laser specifications as shown in step 700. The output power monitor signal returned via lead 106 is maintained at a substantially constant value by controlling, via lead 104, the injection current from source 102 using steps 701–704 for laser output power control.

Figure 7:
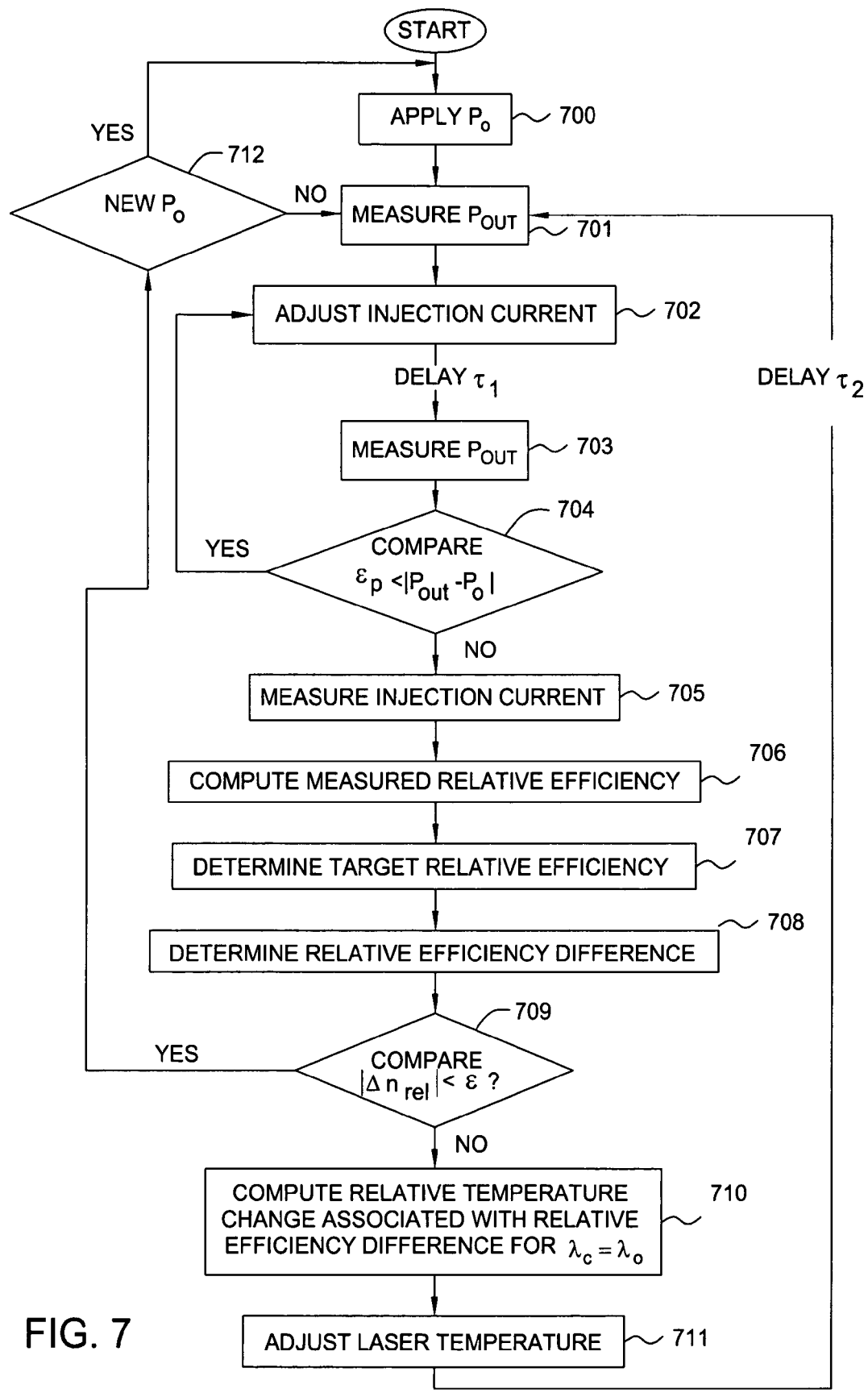
FIG. 7 shows details of the laser operating wavelength control and stabilization method shown in FIG. 2.

In step 701, the laser output power $P_{out}$ is measured. The injection current from source 102 is then adjusted in step 702. After a brief delay of $\tau_1$ to allow settling of the laser parameters in response to the current adjustment, the laser output power $P_{out}$ is again measured in step 703. In step 704, the output power is compared with the target output power for the laser to determine whether the difference or the absolute value of the difference (as shown in FIG. 7) between the two power values is less than a power threshold $\epsilon_p$. When the difference of the two powers is greater than the threshold, control is returned to step 702; when the difference of the two powers is less than or equal to the threshold, the method proceeds to step 705.

In step 705, the injection current I is also measured at an arbitrary temperature T and at an arbitrary time t. In step 706, this current I in conjunction with the current $I_0$ using Eq. 2 is then used to compute a measured relative efficiency $\eta_{rel,meas}$ of Eq. 1 for the laser corresponding to operation at output power $P_{out}$ for an operating wavelength $\lambda_c=\lambda_1$, or rewritten more completely in functional language as, $\eta_{rel,meas}(P_{out},\lambda_c=\lambda_1)$.

In step 707, the target relative efficiency $\eta_{rel,target}$ is determined by Eq. 3 for the target output power $P_{out}$ at the desired operating wavelength $\lambda_c=\lambda_0$. Using the target relative efficiency $\eta_{rel,target}$ together with the measured relative efficiency in step 708, it is possible to compute the relative efficiency difference $\Delta\eta_{rel,target}-\eta_{rel,meas}$ for the particular output power $P_{out}$.

If the relative efficiency difference is less than or equal to some predetermined wavelength adjustment threshold level, $\epsilon$, then it can be assumed that sufficient accuracy has been achieved in the control of the laser operating wavelength and that the laser is operating at or sufficiently close to the target wavelength at a desired output power level, as shown in step 709. Typically, the threshold value $\epsilon$ is a relatively small number. In experimental practice, the threshold value employed has been on the order of ±2 nm for Raman pump lasers operating in a co-propagating mode (e.g., multi-mode Fabry-Perot lasers) or ±0.1 nm for WDM signal lasers (e.g., single-mode DFB lasers). At this point, the process control is transferred to step 712 because the laser parameters are at the desired operating points. If the comparison shown that the relative efficiency is greater than or equal to the threshold, then the method proceeds to step 710 for further adjustments.

Since the ratio of the change in laser temperature $\Delta T$ to the change in relative efficiency $\Delta\eta_{rel}$ is known from characterization Step 4 above, the value of the ratio $\Delta T/\Delta\eta_{rel}$ can be used with the value of the relative efficiency difference $\Delta\eta_{rel}$ to determine the relative temperature change from the current temperature that is needed to correct the operating wavelength of the laser to be at the target operating wavelength $\lambda_c=\eta_0$ with a constant output power $P_{out}$, as shown in step 710. In step 711, the temperature of the laser is then adjusted to the new target temperature $T_{target}$ to achieve target wavelength operation, where $T_{target}=T+\Delta T$. In turn, the injection current is adjusted to achieve operation at the desired output power level. In order to avoid laser temperature fluctuation, it may be desirable to apply only a portion of $\Delta T$ to make the change in laser temperature.

After a delay $\tau_2$ to allow stabilization of the laser temperature, control for the method is returned back to step 701. This process is iterated until both output power and relative efficiency are in the desired range. Once the desired operating values are achieved, these values are checked on a regular basis in order to compensate for environmental changes or aging effects. Since these effects cause relatively slow changes in the operating parameters, iterations can occur on the order of every few minutes. Also, as shown in step 712, the control loop will be restarted at step 700 when the laser is being adjusted to operate at a new target output power $P_0$. Otherwise, the process repeats the monitoring at step 701.

Figure 8:
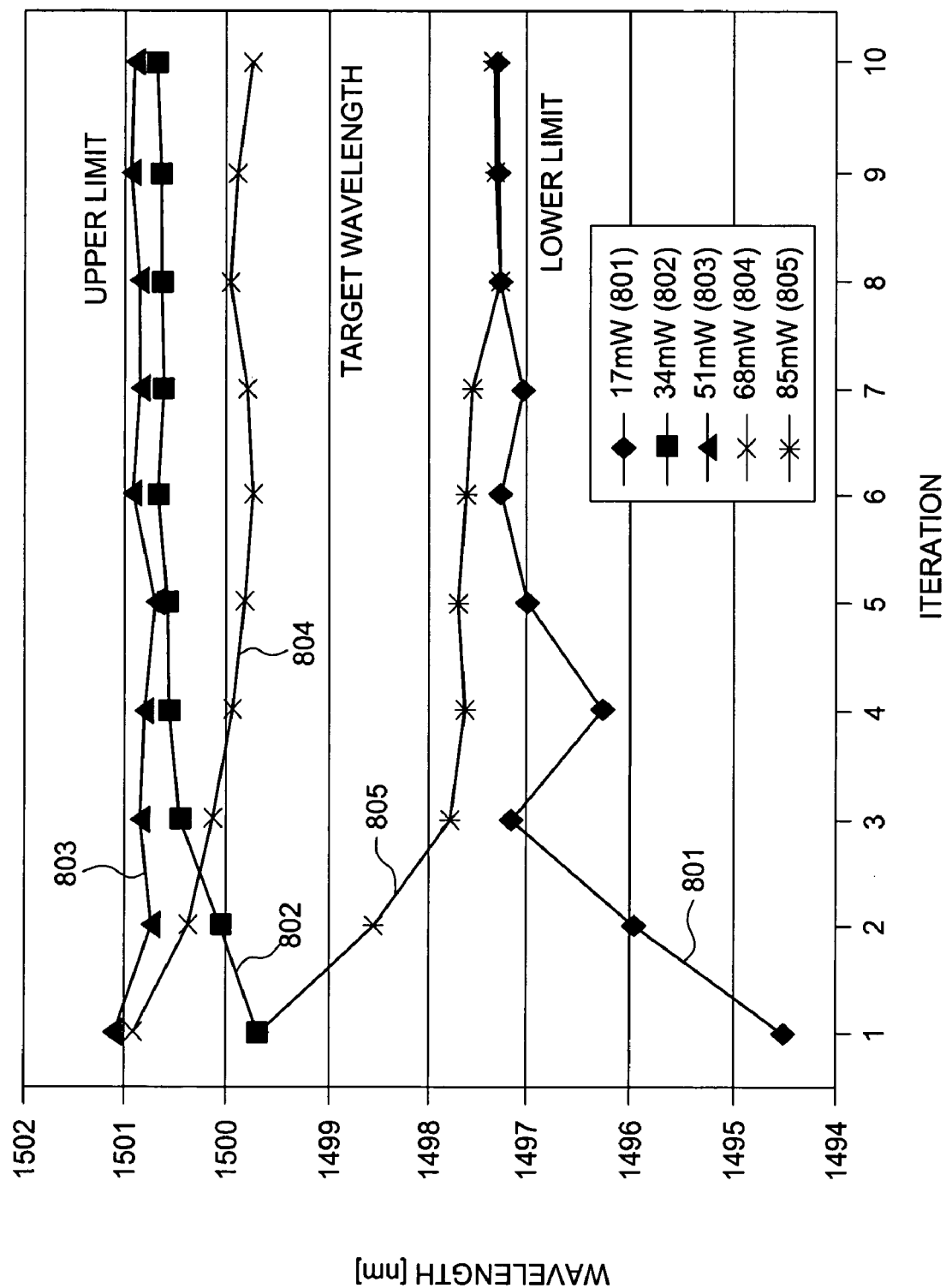
FIG. 8 show results of multiple iterations of an exemplary laser operating wavelength control and stabilization method from FIG. 7 at different output powers for the laser.

In an example from experimental practice, the characterization and control technique is applied to a multi-mode Fabry-Perot semiconductor laser being used for Raman co-pumping (that is, the pump and transmission signals are co-propagating in the system) with the results of the wavelength stabilization shown in FIG. 8. For this example, the target operating wavelength of the laser is set to 1499 nm and the output power is varied over the range from 17 mW to 85 mW (i.e., 5×17 mW). Line 801 depicts the convergence of the laser operating wavelength to the target for an output power of 17 mW; line 802 depicts the convergence of the laser operating wavelength to the target for an output power of 34 mW; line 803 depicts the convergence of the laser operating wavelength to the target for an output power of 51 mW; line 804 depicts the convergence of the laser operating wavelength to the target for an output power of 68 mW; and line 805 depicts the convergence of the laser operating wavelength to the target for an output power of 85 mW. The results shown in FIG. 8 exhibit a stabilization of the operating wavelength to a range within ±2 nm. The procedure converges rapidly and in a well-behaved manner independent of the output power level.

If a laser exhibits a relatively broad tuning range suitable for DWDM or WDM applications or some other application that requires wavelength tuning, a family of these characterization curves will be created for different target operating wavelengths. Then the corresponding control parameters are retrieved from storage to sweep the laser to its new operating wavelength.

While the foregoing is directed to embodiments of the present invention, other and further embodiments of the invention may be devised without departing from the basic scope thereof, and the scope thereof is determined by the claims that follow.

The invention claimed is:

1. Apparatus for controlling the operating wavelength of a laser to be substantially equal to a predetermined wavelength, the apparatus comprising:
   a laser means including the laser, a controllable current source coupled to said laser for varying the injection current supplied to the laser, and a controllable thermal element coupled to the laser for varying the temperature of the laser;
   a controller coupled to the laser means to monitor a set of one or more operating parameters selected from the group consisting of injection current supplied to the laser, operating temperature of the laser, operating wavelength of the laser, and output power of the laser, the controller for characterizing desired parameters of the laser by:
       characterizing a reference laser injection current $I_0$ as a function of the laser output power $P_{out}$ for a constant reference temperature of the laser $T_0$;
       characterizing a laser injection current I and a corresponding laser temperature T as a function of the laser output power $P_{out}$ at a constant operating wavelength substantially equal to a target wavelength $\lambda_0$;
       computing a ratio of the characterized laser injection current $I_0$ to the characterized laser injection current I in order to determine a relative efficiency $\eta_{rel}$ of the laser;
       determining a relationship between the change in laser temperature $\Delta T$ and a change in relative efficiency $\Delta\eta_{rel}$ for the laser when the wavelength of the laser is maintained substantially constant at least at the target wavelength $\lambda_0$; and
       storing characterizations of the reference laser injection current and the laser injection current.

2. The apparatus as defined in claim 1 wherein the controller also controls the operating wavelength of the laser by:
   controlling the injection current I to the laser so that a difference between the target output power $P_0$ and the output power $P_{out}$ is less than or equal to a predetermined power threshold;
   determining a measured relative efficiency $\eta_{rel,meas}$ for the laser operating at the output power $P_{out}$ and a wavelength $\lambda_1$ as a ratio of the injection current and the characterized reference injection current;
   comparing a difference between the measured relative efficiency $\eta_{rel,meas}$ and a target relative efficiency $\eta_{rel,target}$ to a wavelength adjustment threshold value $\epsilon$, wherein the target relative efficiency and the wavelength adjustment threshold value are stored in the controller;
   if the difference of relative efficiencies is greater than the wavelength adjustment threshold value, controlling the laser temperature to change by an amount determined from said relationship between the change in laser temperature $\Delta T$ and the change in relative efficiency $\Delta\eta_{rel}$ for the laser when the wavelength of the laser is maintained substantially constant at least at the target wavelength $\lambda_0$, so that the laser concurrently operates substantially at the target wavelength $\lambda_0$ and substantially at the target output power $P_0$.

3. A method for characterizing a group of operating parameters of a laser, the method including the steps of:
   monitoring a set of one or more operating parameters selected from the group consisting of injection current supplied to the laser, operating temperature of the laser, operating wavelength of the laser, and output power of the laser;
   characterizing the laser injection current $I_0$ as a function of the laser output power $P_{out}$ for a constant reference temperature of the laser $T_0$;
   characterizing the laser injection current I and a corresponding laser temperature T as a function of the laser output power $P_{out}$ at a constant operating wavelength substantially equal to a target wavelength $\lambda_0$;
   computing a ratio of the characterized laser injection current $I_0$ to the characterized laser injection current I in order to determine a relative efficiency $\eta_{rel}$ of the laser;
   determining a relationship between the change in laser temperature $\Delta T$ and a change in relative efficiency $\Delta\eta_{rel}$ for the laser when the wavelength of the laser is maintained substantially constant at least at the target wavelength $\lambda_0$; and
   storing characterizations of the reference laser injection current and the laser injection current.

4. The method as defined in claim 3 also for controlling the operating wavelength of the laser, the method further including the steps of:
   controlling the injection current I to the laser so that a difference between the target output power $P_0$ and the output power $P_{out}$ is less than or equal to a predetermined power threshold;
   determining a measured relative efficiency $\eta_{rel,meas}$ for the laser operating at the output power $P_{out}$ and a wavelength $\lambda_1$ as a ratio of the injection current and the characterized reference injection current;
   comparing a difference between the measured relative efficiency $\eta_{rel,meas}$ and a target relative efficiency $\eta_{rel,target}$ to a wavelength adjustment threshold value $\epsilon$, wherein the target relative efficiency and the wavelength adjustment threshold value are stored in the controller;
   if the difference of relative efficiencies is greater than the wavelength adjustment threshold value, controlling the laser temperature to change by an amount determined from said relationship between the change in laser temperature $\Delta T$ and the change in relative efficiency $\Delta\eta_{rel}$ for the laser when the wavelength of the laser is maintained substantially constant at least at the target wavelength $\lambda_0$, so that the laser concurrently operates substantially at the target wavelength $\lambda_0$ and substantially at the target output power $P_0$.

* * * * *